US012040311B1

(12) United States Patent
Brewer et al.

(10) Patent No.: US 12,040,311 B1
(45) Date of Patent: Jul. 16, 2024

(54) SUBSTRATE DEBONDING FROM BONDED PART

(71) Applicant: The Boeing Company, Chicago, IL (US)

(72) Inventors: Peter D. Brewer, Westlake Village, CA (US); Chia-Ming Chang, Agoura Hills, CA (US); Sevag Terterian, Lake Balboa, CA (US); Charbel Abijaoude, Newbury Park, CA (US); Diego Eduardo Carrasco, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 99 days.

(21) Appl. No.: 18/145,462

(22) Filed: Dec. 22, 2022

(51) Int. Cl.
    B23K 1/00 (2006.01)
    B23K 1/018 (2006.01)
    (Continued)

(52) U.S. Cl.
    CPC .............. H01L 24/98 (2013.01); B23K 1/018 (2013.01); H01L 24/799 (2013.01); B23K 20/026 (2013.01); B23K 2101/40 (2018.08); H01L 24/13 (2013.01); H01L 24/16 (2013.01); H01L 24/81 (2013.01); H01L 2224/13109 (2013.01); H01L 2224/13124 (2013.01);
    (Continued)

(58) Field of Classification Search
    CPC ....... H01L 24/98; H01L 24/799; H01L 24/13; H01L 24/16; H01L 24/81; H01L 2224/13109; H01L 2224/13124; H01L 2224/13144; H01L 2224/13147; H01L 2224/16145; H01L 2224/7999; H01L 2224/81203; H01L 2224/98; H01L 2924/35121; B23K 20/026; B23K 2101/36–42; B23K 1/0016; B23K 1/018
    USPC ............................ 228/119, 191, 264, 13, 19
    See application file for complete search history.

(56) References Cited

U.S. PATENT DOCUMENTS 5,264,699 A * 11/1993 Barton ................... H01L 21/563
                                                          438/59
10,217,637 B1 * 2/2019 Budd ....................... H01L 24/94
(Continued)

FOREIGN PATENT DOCUMENTS

CN         1360815 A  *  7/2002    ........... H01L 21/563
CN       101558483 A  * 10/2009    ......... H01L 21/4763
(Continued)

*Primary Examiner* — Kiley S Stoner
(74) *Attorney, Agent, or Firm* — Quinn IP Law

(57) ABSTRACT

A method for debonding a bonded part includes attaching a handle to a third side of a first substrate of the bonded part with an adhesive layer. The bonded part has a plurality of inter-substrate bond structures that couple a first side of the first substrate to a second side of a second substrate. The third side of the first substrate is opposite the first side. The first substrate and the second substrate have different thicknesses. The method includes absorbing a solvent into the adhesive layer, swelling the adhesive layer in response to the absorbing of the solvent, bending the first substrate in response to the swelling, and breaking a plurality of thermocompression bonds between the plurality of inter-substrate bond structures and the second side of the second substrate in response to the bending to debond the first substrate.

20 Claims, 9 Drawing Sheets

(51) Int. Cl.
*H01L 23/00* (2006.01)
*B23K 20/02* (2006.01)
*B23K 101/40* (2006.01)

(52) U.S. Cl.
CPC .............. *H01L 2224/13144* (2013.01); *H01L 2224/13147* (2013.01); *H01L 2224/16145* (2013.01); *H01L 2224/7999* (2013.01); *H01L 2224/81203* (2013.01); *H01L 2224/98* (2013.01); *H01L 2924/35121* (2013.01)

(56) References Cited

U.S. PATENT DOCUMENTS

2019/0348392 A1\* 11/2019 Chen .................. H01L 24/95
2020/0161230 A1\* 5/2020 Knickerbocker ............................ H01L 21/76898
2021/0358778 A1\* 11/2021 Han ................... H01L 21/6836

FOREIGN PATENT DOCUMENTS

| | | | | |
|---|---|---|---|---|
| KR | 101878632 B1 | \* | 8/2015 | |
| KR | 101605298 B1 | \* | 3/2016 | |
| TW | 201632603 A | \* | 9/2016 | .............. C09J 11/06 |
| WO | WO-0245152 A2 | \* | 6/2002 | ........... H01L 21/563 |

\* cited by examiner

SUBSTRATE DEBONDING FROM BONDED PART

TECHNICAL FIELD

The disclosure relates generally to flip-chip bonding, and in particular, to a substrate debonding from a bonded part.

BACKGROUND

Current computing systems involve dense integrations of a range of different elements, including processors, application specific integrated circuit accelerators, memory devices, high speed input/output devices, network processing devices, and power delivery/power management devices. Three-dimensional integration of the devices provides a performance advancement due to an increase in interconnectivity between constituent elements. The three-dimensional integration involves inter-chip thermocompression bonding. Thermocompression bonding at fine-pitch spacings often involves thermally compressing gold-covered bonding bumps at elevated temperatures and elevated pressures. Melting the gold to debond a chip involves significant heat that risks damaging the chip.

Accordingly, those skilled in the art continue with research and development efforts in the field of selectively detaching inter-chip thermally bonded integrated assemblies.

SUMMARY

A method for debonding a bonded part is provided herein. The method includes attaching a handle to a third side of a first substrate of the bonded part with an adhesive layer. The bonded part has a plurality of inter-substrate bond structures that couple a first side of the first substrate to a second side of a second substrate. The third side of the first substrate is opposite the first side. The first substrate and the second substrate have different thicknesses. The method includes absorbing a solvent into the adhesive layer, swelling the adhesive layer in response to the absorbing of the solvent, bending the first substrate in response to the swelling, and breaking a plurality of thermocompression bonds between the plurality of inter-substrate bond structures and the second side of the second substrate in response to the bending to debond the first substrate.

In one or more embodiments of the method, the breaking includes generating a plurality of localized stress concentrations at the plurality of thermocompression bonds in response to the bending. The bending is in response to the different thicknesses of the first substrate and the second substrate as the adhesive layer swells.

In one or more embodiments of the method, the swelling includes moving the swelling of the adhesive layer radially inward over time as the solvent is absorbed further into the adhesive layer.

In one or more embodiments of the method, the breaking includes disrupting of the plurality of thermocompression bonds row-by-row in response to the plurality of localized stress concentrations.

In one or more embodiments of the method, one or more third substrates bonded to the second substrate remain bonded to the second substrate as the first substrate is debonded.

In one or more embodiments, the method includes reforming the bonded part by a thermocompression bonding of the first substrate to the second substrate.

In one or more embodiments, the method includes reforming the bonded part by a thermocompression bonding of another first substrate to the second substrate.

In one or more embodiments of the method, the plurality of thermocompression bonds are one or more of gold-to-gold bonds, copper-to-copper bonds, aluminum-to-aluminum bonds and indium-to-indium bonds.

In one or more embodiments of the method, the adhesive layer is an acrylic polymer layer and the solvent is acetone.

A debonding system is provided herein. The debonding system includes a handle, an adhesive layer, and a solvent. The handle is couplable to a bonded part. The bonded part has a plurality of inter-substrate bond structures that couple a first side of a first substrate to a second side of a second substrate. A third side of the first substrate is opposite the first side. The first substrate and the second substrate have different thicknesses. The adhesive layer is configured to attach the handle to the third side of the first substrate. The solvent is configured to be absorbed into the adhesive layer. The adhesive layer swells in response to the absorption of the solvent. The first substrate bends in response to the swelling. A plurality of thermocompression bonds between the plurality of inter-substrate bond structures and the second side of the second substrate is broken in response to the bending to debond the first substrate.

In one or more embodiments of the debonding system, the plurality of thermocompression bonds are broken by a plurality of localized stress concentrations at the plurality of thermocompression bonds generated in response to the bending. The bending is in response to the different thicknesses of the first substrate and the second substrate as the adhesive layer swells.

In one or more embodiments of the debonding system, the swell of the adhesive layer moves radially inward over time as the solvent is absorbed further into the adhesive layer.

In one or more embodiments of the debonding system, the plurality of thermocompression bonds are broken by a plurality of disruptions of the plurality of thermocompression bonds row-by-row in response to the plurality of localized stress concentrations.

In one or more embodiments of the debonding system, one or more third substrates bonded to the second substrate remain bonded to the second substrate as the first substrate is debonded.

In one or more embodiments, the debonding system includes a press configured to reform the bonded part by a thermocompression bonding of the first substrate to the second substrate.

In one or more embodiments, the debonding system includes a press configured to reform the bonded part by a thermocompression bonding of an additional first substrate to the second substrate.

In one or more embodiments of the debonding system, the plurality of thermocompression bonds are one or more of gold-to-gold bonds, copper-to-copper bonds, aluminum-to-aluminum bonds and indium-to-indium bonds.

In one or more embodiments of the debonding system, the adhesive layer is an acrylic polymer layer and the solvent is acetone.

A method for debonding a bonded part is provided herein. The method includes applying an adhesive layer to a third side of a first substrate of the bonded part. The bonded part has a plurality of inter-substrate bond structures that couple a first side of the first substrate to a second side of a second substrate. The plurality of inter-substrate bond structures couple one or more third substrates to the second side of the second substrate. The third side of the first substrate is opposite the first side. The first substrate and the second substrate have different thicknesses. The one or more third substrates have a different thickness than the second substrate. The method includes attaching a handle to the adhesive layer, absorbing a solvent into the adhesive layer, swelling the adhesive layer in response to the absorbing of the solvent, bending the first substrate in response to the swelling breaking a plurality of thermocompression bonds between the plurality of inter-substrate bond structures between the first substrate and the second substrate in response to the bending, and leaving the one or more third substrates bonded to the second substrate.

In one or more embodiments, the method includes curing the adhesive layer by an exposure to a light directed through the handle.

The above features and advantages, and other features and advantages of the present disclosure are readily apparent from the following detailed description of the best modes for carrying out the disclosure when taken in connection with the accompanying drawings.

DETAILED DESCRIPTION

Embodiments of the present disclosure include a system and a method for a detachment technique that is capable of selectively debonding fine-pitch thermocompression bonded chips (e.g., bonded with planar bond pads or spike-like structures) from two-dimensional arrays or three-dimensional stacks. The technique utilizes an actuation of a neighboring adhesive layer that causes localized stress concentrations within an underlying fine-pitch bond interface. The actuation of the adhesion layer is induced by the radially inward swelling of a layer by absorption of a solvent (e.g., acetone). The dynamic swelling mechanism induces a row-by-row peeling of the fine-pitch bonds. The debonding mechanism imparts local concentrated stress distributions to the bonded interface that are not replicable with direct pulling type mechanisms. The local concentrated stress distributions allow a fractional force (e.g., <100 times) to effectively unzip the bond interface compared with direct pulling mechanisms that engage an entirety or a large fraction of the bond pad arrays to debond. The resulting debonding force also mitigates a risk of chip damage.

Figure 1:
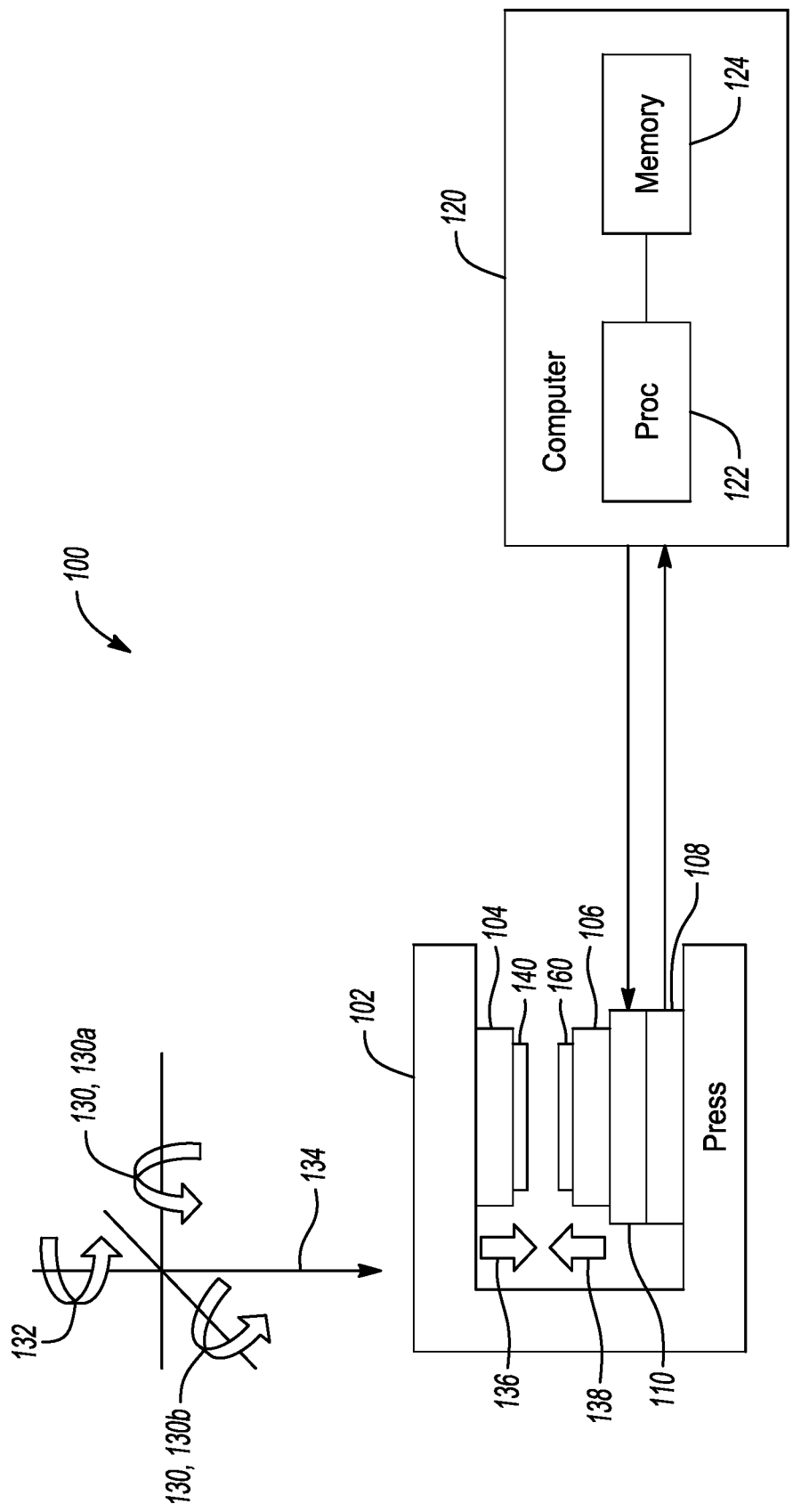
FIG. 1 is a schematic diagram of a compression system in accordance with one or more exemplary embodiments.

Referring to FIG. 1, a schematic diagram of an example implementation of a compression system 100 is shown in accordance with one or more exemplary embodiments. The compression system 100 generally includes a press 102 and a computer 120. The press 102 includes a top chuck 104, a bottom chuck 106, a load cell 108, and a heater 110. The computer 120 includes one or more processors 122 (one shown) and one or more memory devices 124 (one shown).

The press 102 implements a precision die bonder. In various embodiments, the press 102 implements a substrate-to-substrate thermocompression press. The press 102 is operational to align and press two substrates together to form inter-substrate connections. The alignment may be provided by movement of the top chuck 104 relative to the bottom chuck 106 in multiple dimensions. By way of example, the top chuck 104 may tilt 130 relative to the bottom chuck 106. The tilt 130 may include movement in a pitch direction 130a and a roll direction 130b. In some embodiments, the bottom chuck 106 may be rotatable relative to the top chuck 104 in a yaw direction 132. In other embodiments, the top chuck 104 may be rotatable relative to the bottom chuck 106 in the yaw direction 132. The top chuck 104 is also moveable relative to the bottom chuck 106 in a vertical direction 134.

Movement of the top chuck 104 downward along the vertical direction 134 presses a first substrate 140 being held by the top chuck 104 against a second substrate 160 being held by the bottom chuck 106 with an applied pressure 136 (or force). The applied pressure 136 compresses inter-substrate bond structures on the first substrate 140 into corresponding pads on the second substrate 160. In some embodiments, the first substrate 140 may be held by the bottom chuck 106 and the second substrate 160 may be held by the top chuck 104. The load cell 108 measures the applied pressure 136 being applied between the first substrate 140 and the second substrate 160.

The top chuck 104 and the bottom chuck 106 each implement a vacuum chuck. The top chuck 104 and the bottom chuck 106 are operational to hold the first substrate 140 and the second substrate 160 during the bonding process.

The load cell 108 implements a pressure sensor. The load cell 108 is operational to detect the applied pressure 136 applied by the second substrate 160 onto the first substrate 140 during a calibration test of the press 102.

The heater 110 implements a variable heat source controlled by the computer 120. The heater 110 is operational to heat the first substrate 140 and the second substrate 160 to one or more temperatures determined by the computer 120. During a thermocompression bonding process, the heater 110 raises the temperature of the first substrate 140 and the second substrate 160 to a bonding temperature appropriate for bonding the materials used in inter-substrate bump bonds.

The computer 120 is coupled to the heater 110 and the load cell 108. The computer 120 implements one or more data processing computers. In embodiments with multiple computers 120, the individual computers 120 are coupled together to share data, memory space, and processing resources. The computer 120 may be operational to store the configuration data of the press 102 and execute software used to control the heater 110 and analyze the information received from the load cell 108.

The processor 122 implements one or more processors within the computer 120. The processor 122 is in communication with the memory device 124 to exchange commands and data. The processor 122 is operational to execute the software tools used to analyze the data generated by the load cell 108.

The memory device 124 implements one or more non-transitory computer readable storage devices (e.g., random access memory, read-only memory, magnetic hard drives, solid-state drives, etc.). The memory device 124 stores software programs (or tools) that are executed by the processor 122.

The thermocompression bonding process applied to the inter-substrate bond structures may be similar to standard bump bond structure bonding processes. For example, thermocompression bonding may be performed at approximately 200 degrees Celsius (° C.) for gold and approximately 300° ° C. for copper and aluminum while under pressure (e.g., >40 megapascals (MPa) of bond metal area).

Figure 2:
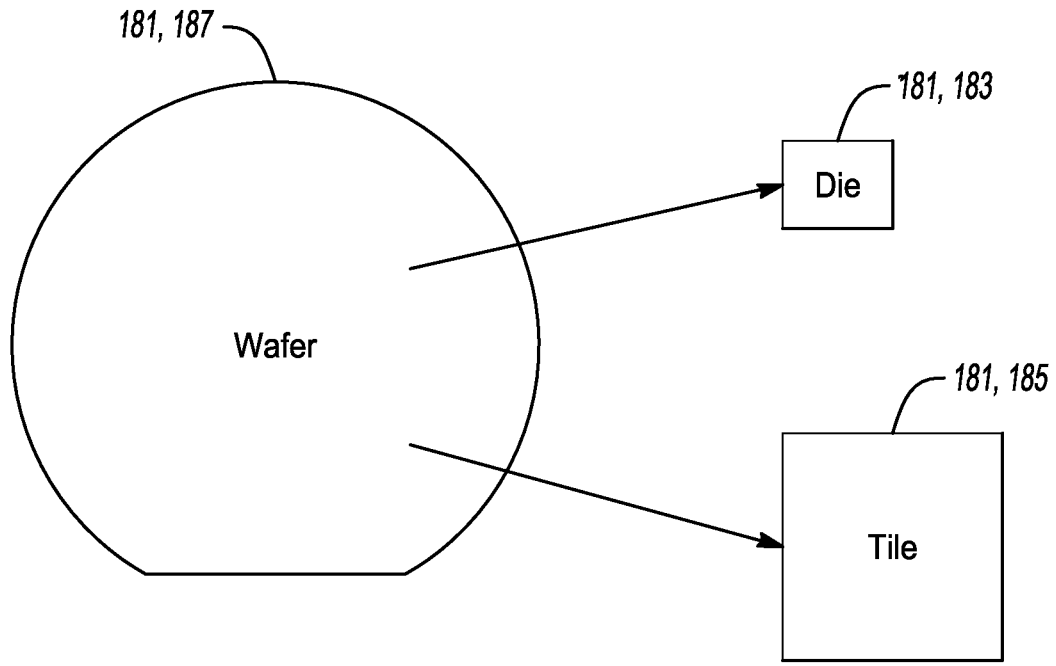
FIG. 2 is a schematic plan diagram of various substrates in accordance with one or more exemplary embodiments.

Referring to FIG. 2, a schematic plan diagram of example implementations of various substrates are shown in accordance with one or more exemplary embodiments. The substrate may be formed of a semiconductor 181. The semiconductor 181 generally includes silicon, germanium, gallium arsenide, aluminum gallium arsenide, silicon carbide, gallium nitride, indium phosphide and the like. The substrates may be in the form of a semiconductor die 183 (or chip), a semiconductor tile 185, or a semiconductor wafer 187.

Figure 3:
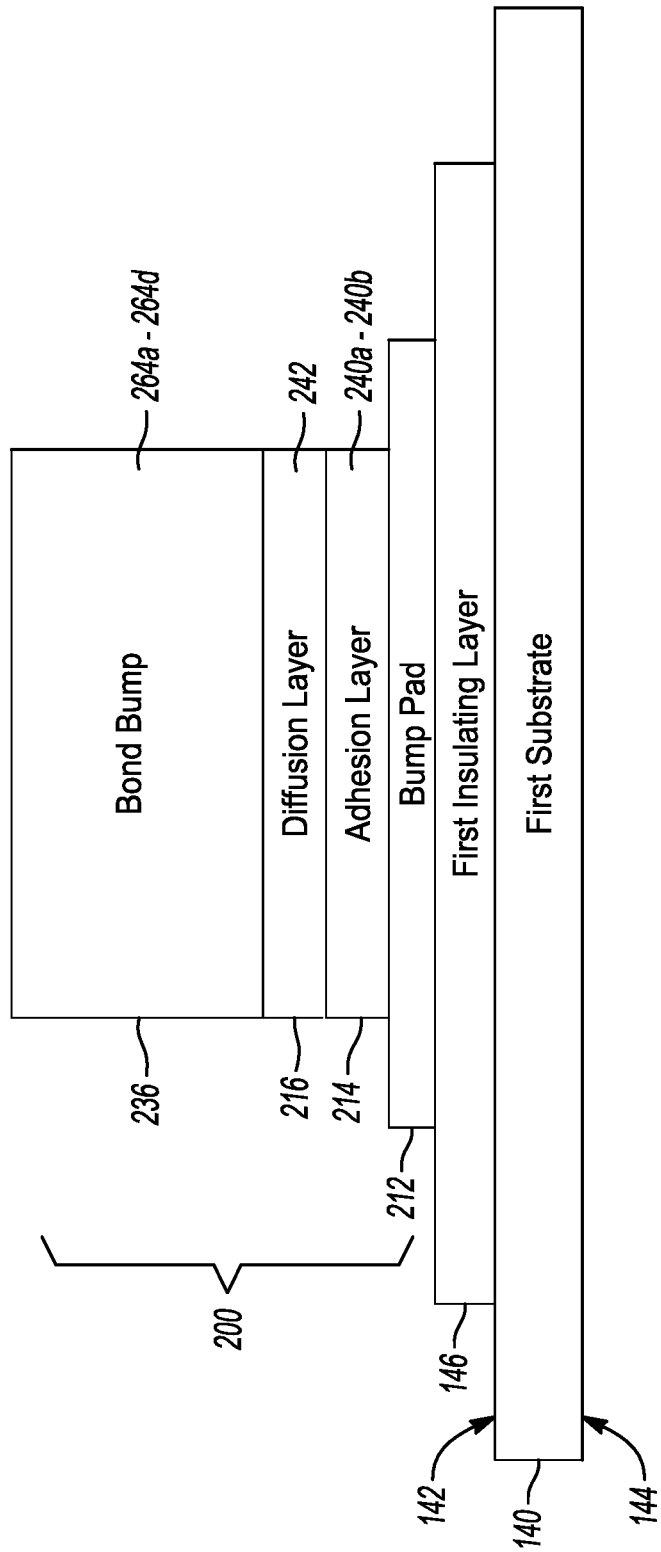
FIG. 3 is a schematic side diagram of an inter-substrate bond structure in accordance with one or more exemplary embodiments.

Referring to FIG. 3, a schematic side diagram of an example implementation of an inter-substrate bond structure is shown in accordance with one or more exemplary embodiments. The inter-substrate bond structure 200 illustrates a solid contact that may be used multiple times (e.g., at least twice). The inter-substrate bond structure 200 is formed on the first substrate 140. The first substrate 140 has a first side 142 and a third side 144 opposite the first side 142. A first insulating layer 146 may be formed on the first side 142 of the first substrate 140.

The inter-substrate bond structure 200 may be fabricated on the first insulating layer 146. The inter-substrate bond structure 200 includes a bump pad 212, a diffusion layer 216 and a bond bump 236

The bump pad 212 implements a bonding pad that provides mechanical and electrical connections to the inter-substrate bond structure 200. The bump pad 212 is operational to pass signals and/or power between circuitry (not shown) on the first substrate 140 and the second substrate 160. The bump pad 212 is generally formed of gold 264a, copper 264b, aluminum 264c, or indium 264d. Other conductive metal layers may be used for the bump pad 212 to meet the design criteria of a particular application.

The adhesion layer 214 provides a metallurgical interface between the bump pad 212 and the rest of the inter-substrate bond structure 200. In various embodiments, the adhesion layer 214 may be formed of titanium 240a or chromium 240b. Other metal layers may be implemented to meet the design criteria of a particular application.

The diffusion layer 216 provides a barrier between the adhesion layer 214 and the bond bump 236 that stops migration of metal atoms. The diffusion layer 216 is generally formed of platinum 242. Other metal layers may be implemented to meet the design criteria of a particular application.

The bond bump 236 provides a thermocompression-bond-metal layer formed on the adhesion layer 214. The bond bump 236 is suitable for thermocompression bonding to a thermocompression-bond-metal layer on the second substrate 160. The bond bump 236 may be formed of gold 264a, copper 264b, aluminum 264c, or indium 264d. Other metal layers may be implemented to meet the design criteria of a particular application. The bond metals, other than the indium, generally have melting temperatures in excess of 600 degrees Celsius, so thermal debonding may not be a viable option.

Figure 4:
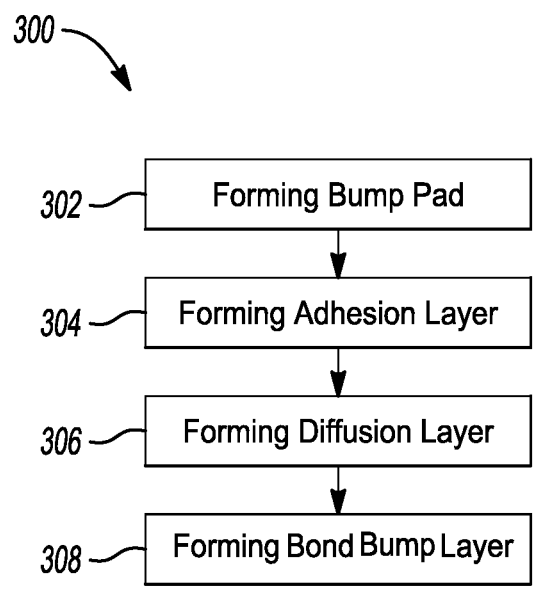
FIG. 4 is a flow diagram of a method of forming the inter-substrate bond structure in accordance with one or more exemplary embodiments.

Referring to FIG. 4 a flow diagram of an example method 300 of forming the inter-substrate bond structure 200 is shown in accordance with one or more exemplary embodiments. The method (or process) 300 may be implemented using standard semiconductor fabricating techniques. The method 300 includes steps 302 to 308, as illustrated. The sequence of steps is shown as a representative example. Other step orders may be implemented to meet the criteria of a particular application. While fabrication of a single inter-substrate bond structure 200 (FIG. 3) is shown, an array of many inter-substrate bond structures 200 may be fabricated concurrently.

Referring to FIGS. 3 and 4, in the step 302, the bump pad 212 is formed by depositing and patterning a metal layer on the first insulating layer 146. The adhesion layer 214 is formed on the bump pad 212 in the step 304. The diffusion layer 216 is formed on the adhesion layer 214 in the step 306 by depositing an adhesion metal. In the step 308, the bond bump 236 is formed on the diffusion layer 216 by depositing the bond metal. In semiconductor wafer fabrication, the inter-substrate bond structure 200 and the debonding process that uses substrate bending to debond first substrate 140 from the second substrate 160, enables reversible substrate attachment.

Figure 5:
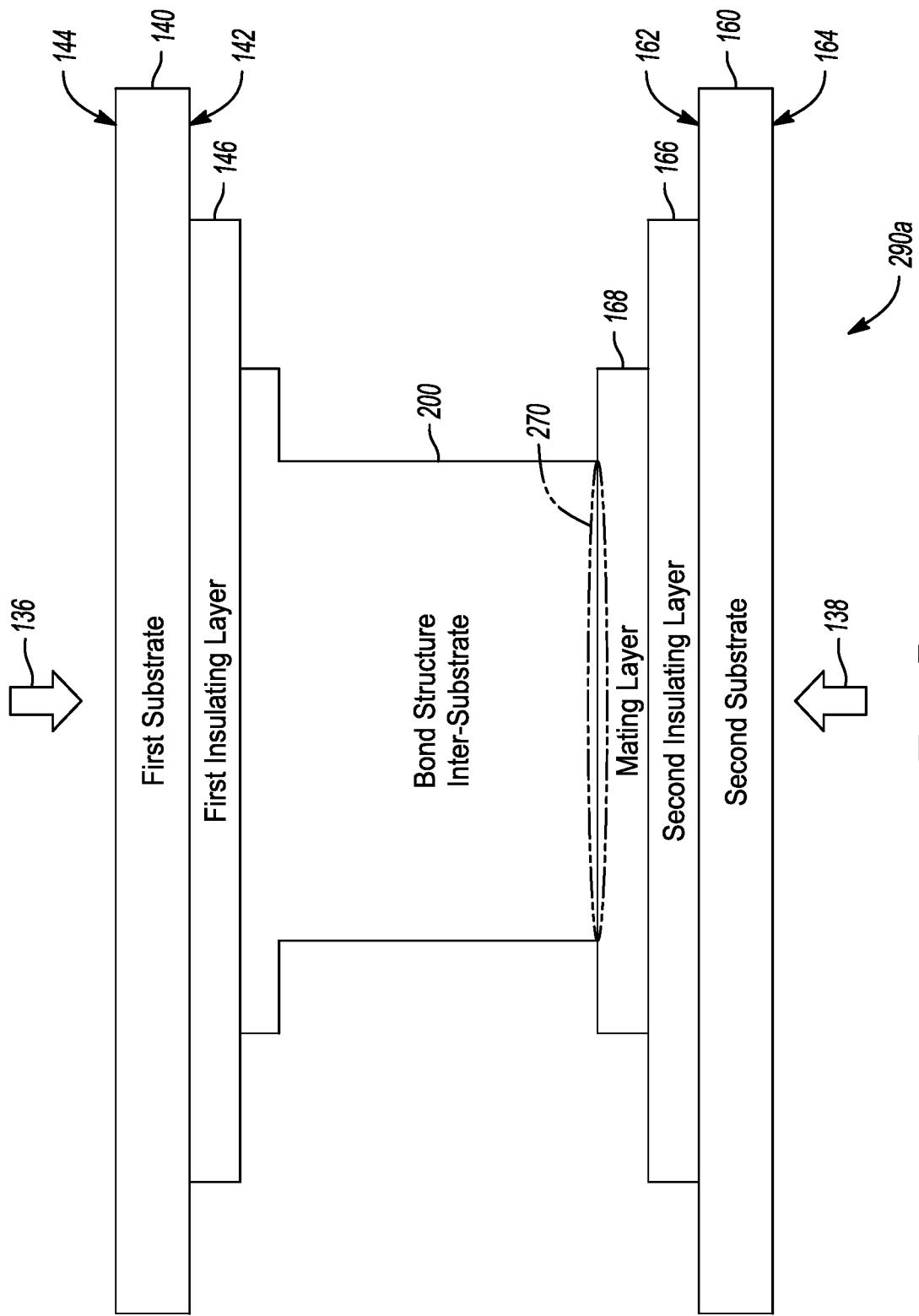
FIG. 5 is a schematic side diagram of a first bonded part in accordance with one or more exemplary embodiments.

Referring to FIG. 5, a schematic side diagram of an example implementation of a first bonded part 290a is shown in accordance with one or more exemplary embodiments. The first bonded part 290a may incorporate the inter-substrate bond structure 200.

The first bonded part 290a includes the first substrate 140, the inter-substrate bond structure 200, and the second substrate 160. The first substrate 140 includes the first side 142, the third side 144, and the inter-substrate bond structure 200. The second substrate 160 includes a second side 162, a fourth surface 164, a second insulating layer 166, and a mating layer 168. The fourth surface 164 is on an opposite side of the second substrate 160 as the second side 162. The second insulating layer 166 is formed on the second side 162. The mating layer 168 is formed on the second insulating layer 166.

The inter-substrate bond structure 200 is aligned with, and in physical contact with the mating layer 168. The applied pressure 136 and the applied heat 138, provided by the press 102, create an initial thermocompression bond 270 between the inter-substrate bond structure 200 and the mating layer 168. The initial thermocompression bond 270 physically attaches and electrically connects the first substrate 140 to the second substrate 160.

Figure 6:
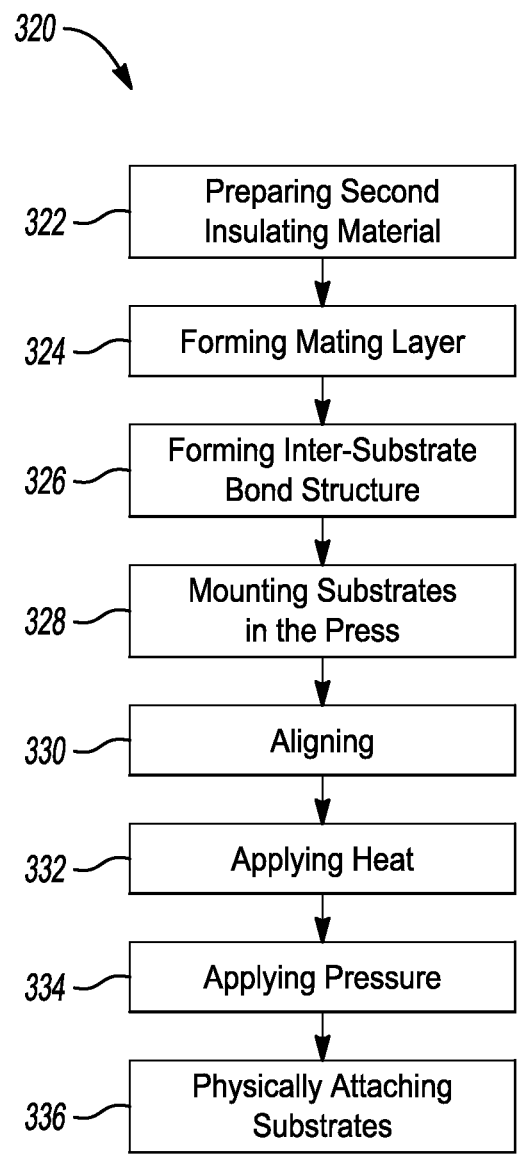
FIG. 6 is a flow diagram of a method to fabricate the first bonded part in accordance with one or more exemplary embodiments.

Referring to FIG. 6, a flow diagram of an example method 320 to fabricate the first bonded part 290a is shown in accordance with one or more exemplary embodiments. The method (or process) 320 may be implemented using standard semiconductor fabricating techniques. The method 320 includes steps 322 to 336, as illustrated. The sequence of steps is shown as a representative example. Other step orders may be implemented to meet the criteria of a particular application.

Referring to FIGS. 1, 5 and 6, in the step 322, the second insulating layer 166 on the second side 162 of second substrate 160 is prepared to receive the mating layer 168. The mating layer 168 is formed on second insulating layer 166 in the step 324. The inter-substrate bond structure 200 may be formed on the first substrate 140 in the step 326 (e.g., the method 300 in FIG. 4).

In the step 328, the first substrate 140 and the second substrate 160 are mounted in the press 102 and aligned in the step 330. The applied heat 138 may be generated in the step 332 to warm the first substrate 140 and the second substrate 160. The applied pressure 136 between the first substrate 140 and the second substrate 160 may be generated in the step 334 to form the initial thermocompression bond 270. The initial thermocompression bond 270 physically and electrically attaches the first substrate 140 to the second substrate 160 to form the first bonded part 290a in the step 336. The first bonded part 290a is subsequently tested for proper communication between the first substrate 140 and the second substrate 160, and overall operations of the resulting circuitry.

Figure 7:
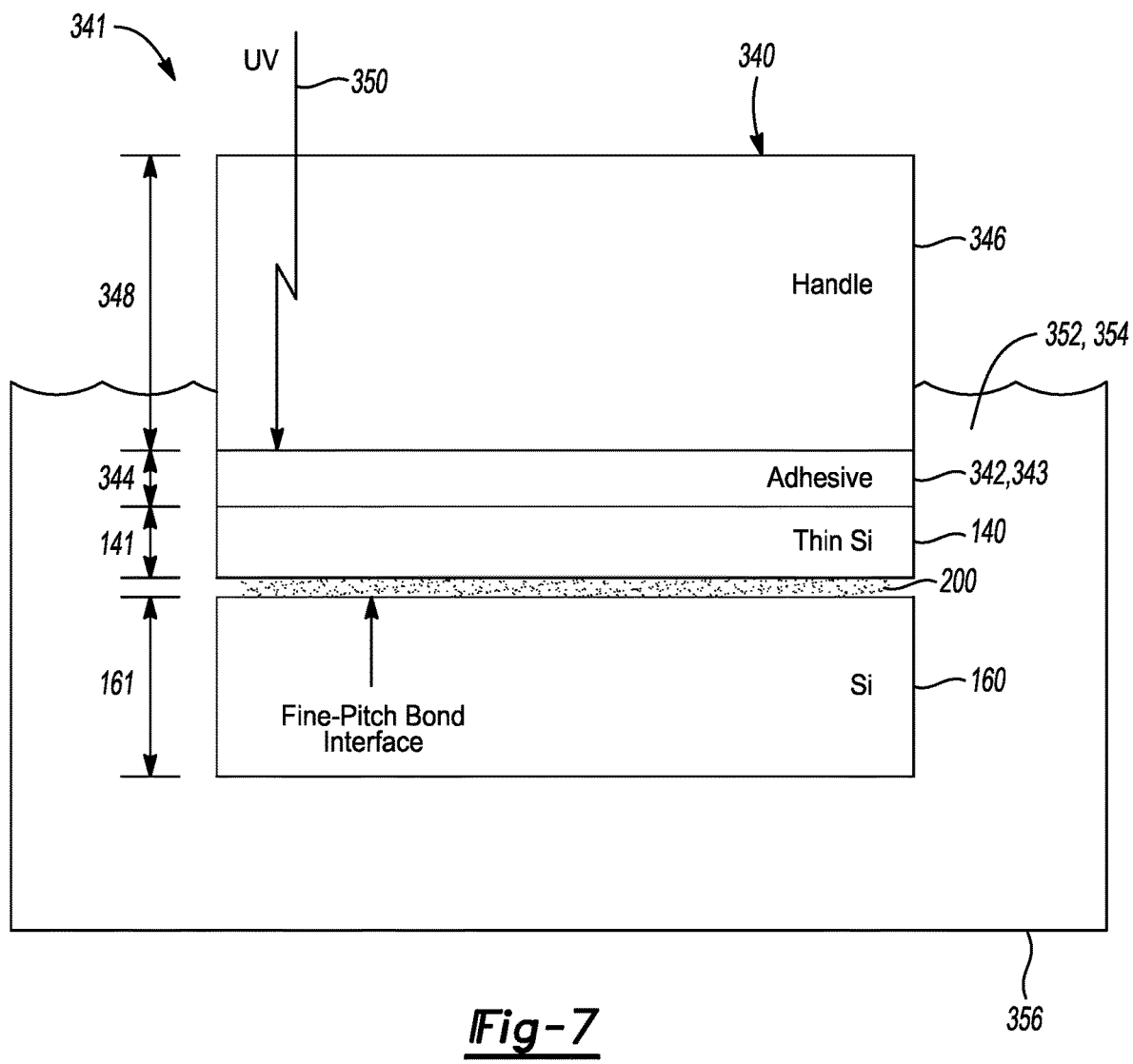
FIG. 7 is a schematic side diagram of a stack-up structure used in debonding in accordance with one or more exemplary embodiments

Referring to FIG. 7, a schematic side diagram of an example implementation of an stack-up structure 340 used in a debonding system 341 is shown in accordance with one or more exemplary embodiments. The stack-up structure 340 generally includes the second substrate 160, the inter-substrate bond structure 200, the first substrate 140, an adhesive layer 342, and a handle 346. The debonding system 341 includes the stack-up structure 340, a solvent 352 and a container 356.

A thickness of the first substrate 140 is less than a thickness of the second substrate 160. The first substrate 140 generally has a first thickness 141. The first thickness 141 may be in a range of approximately 20 micrometers (um) to approximately 100 um (e.g., 30 um). The second substrate 160 has a second thickness 161. The second thickness 161 may be in a range of approximately 400 μm to approximately 600 um (e.g., 500 um). Other first thicknesses 141 and/or other second thicknesses 161 may be implemented to meet the design criteria of a particular application. The asymmetry in thicknesses causes a stress in the bond interfaces between the first substrate 140 and the second substrate 160 when subject to bending since the bending is off the neutral axis.

The adhesive layer 342 is operational to temporarily connect the exposed surface of the first substrate 140 to the handle. The adhesive layer 342 is also operational to swell in response to absorbing a solvent 352. An adhesive thickness 344 of the adhesive layer 342 generally ranges from approximately 40 um to approximately 60 um (e.g., 50 um). In various embodiments, the adhesive layer 342 is an acrylic polymer layer 343. For example, the adhesive layer 342 may be an LC-5230 polymer available from the 3M Company, in Saint Paul, Minnesota. Other adhesive layers may be implemented to meet the design criteria of a particular application. The adhesive layer 342 may be cured by exposure to light (e.g., ultraviolet light 350).

The handle 346 implements a transparent coupon approximately matching a size and shape of the first substrate 140 (e.g., approximately 4 millimeters by 4 millimeters). In various embodiments, the handle 346 may be a glass handle. The handle 346 may have a handle thickness 348 in a range of approximately 600 μm to approximately 1000 um (e.g., 700 um). The handle 346 is generally transparent to the ultraviolet light 350. The ultraviolet light 350 may be directed through the handle 346 to cure the adhesive layer 342.

For debonding, the stack-up structure 340 may be exposed to the solvent 352. For example, the stack-up structure 340 may be submersed in the container 356 of the solvent 352. The solvent 352 is operational to be absorbed into the adhesive layer 342 and thereby cause the adhesive layer 342 to swell. The swelling of the adhesive layer 342 causes localized stress concentrations within the underlying bonded interface (e.g., the bond bumps 236 to the mating layers 168) that induces a cascading row-by-row peeling of the fine-pitch bonds. In various embodiments, the solvent may be an organic solvent. In some embodiments, the solvent may be acetone 354. The solvent 352 is chosen to be inert to the components of the stack-up structure 340, other than the adhesive layer 342.

Figure 8:
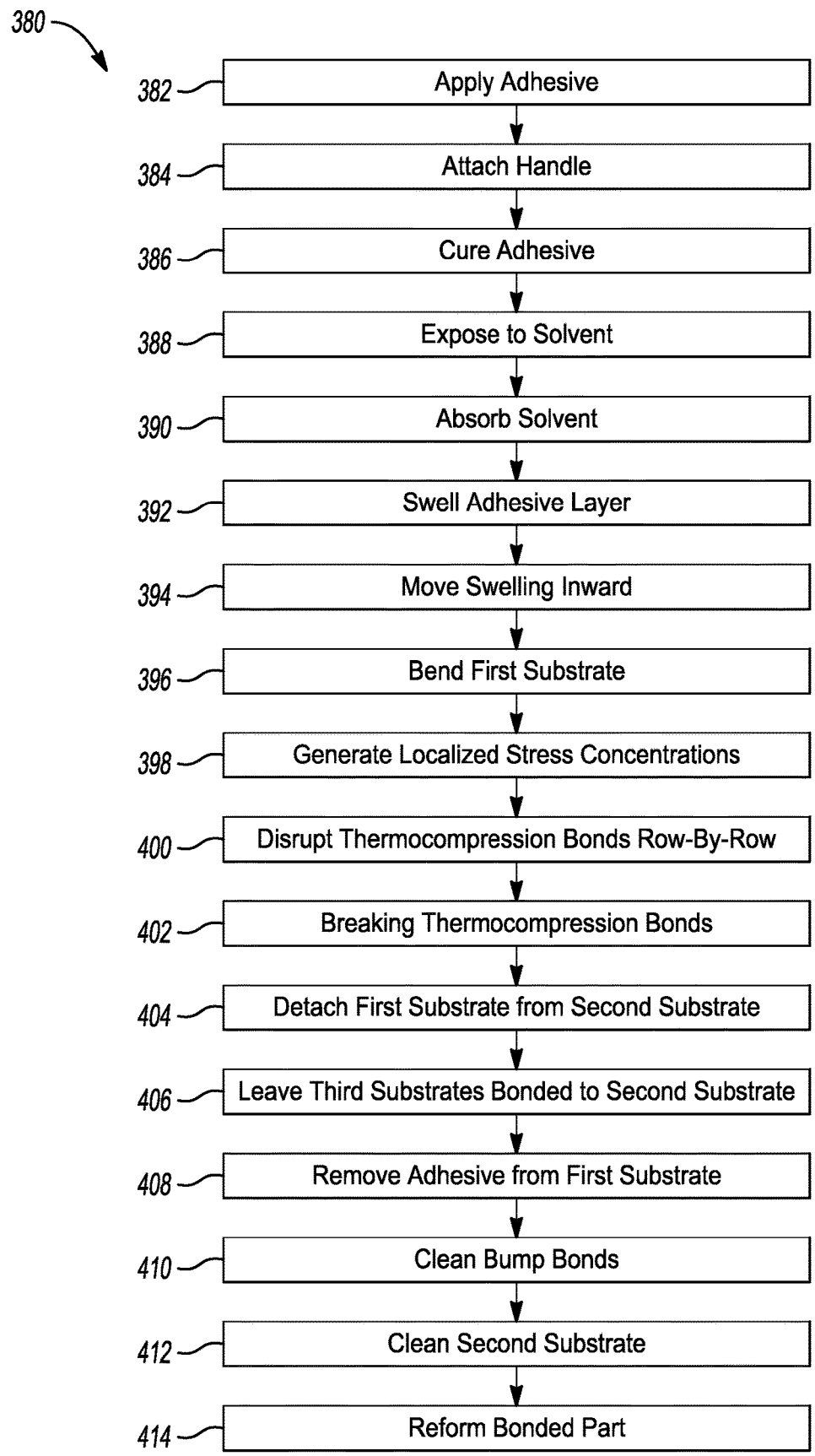
FIG. 8 is a process flow diagram of a debonding process in accordance with one or more exemplary embodiments.

Referring to FIG. 8, a process flow diagram of an example implementation of a debonding process 380 is shown in accordance with one or more exemplary embodiments. The debonding process (or method) 380 is implemented using the stack-up structure 340 and the solvent 352. The method 380 includes steps 382 to 414, as illustrated. The sequence of steps is shown as a representative example. Other step orders may be implemented to meet the criteria of a particular application.

Referring to FIGS. 5, 7 and 8, in the step 382 the adhesive layer 342 is applied to the third side 144 of the first substrate 140. In some embodiments, the adhesive layer 342 may be applied to the handle 346. The handle 346 is subsequently attached to the first substrate 140 in the step 384 using the adhesive layer 342. The adhesive layer 342 may be cured in the step 386 by an exposure to a light (e.g., the ultraviolet light 350) directed through the handle 346.

In the step 388, the bonded part 290a may be exposed to the solvent 352. The solvent 352 is absorbed into the adhesive layer 342 in the step 390. The adhesive layer 342 receives the solvent 352 through an outer peripheral edge. The solvent 352 causes the adhesive layer 342 to swell in the step 392. The swelling moves radially inward over time in the step 394 as the solvent 352 is absorbed further into the adhesive layer 342.

In the step 396, the swelling of the adhesive layer 342 bends the relatively thinner first substrate 140 relative to the relatively thicker second substrate 160. The bending generates localized stress concentrations at the thermocompression bonds in the step 398. The bending is in response to the different thicknesses of the first substrate 140 and the second substrate 160 due to the swelling of the adhesive layer 342. The localized stress concentrations disrupt the thermocompression bonds, row-by-row, in the step 400. The disrupted thermocompression bonds generally break (or at least are weakened) between the plurality of inter-substrate bond structures 200 and the second side 162 of the second substrate 160 to debond the first substrate 140 in the step 402.

In the step 404, the first substrate 140 generally detaches from the second substrate 160 in response to the debonding. In situations where one or more third substrates are bonded to the second substrate 160, the third substrates may remain attached to the second substrate 160 in the step 406. The adhesive layer 342 is removed from the first substrate 140 in the step 408. In cases where the first substrate 140 is to be rebonded to the second substrate 160, the cleaning the exposed ends of the bond bumps 236 may be cleaned in the step 410, and the exposed surface of the second substrate 160 may be cleaned in the step 412. Thereafter, the first substrate 140 or an additional first substrate 140a (FIG. 9) is ready to be rebonded to the second substrate 160 in the step 414.

Figure 9:
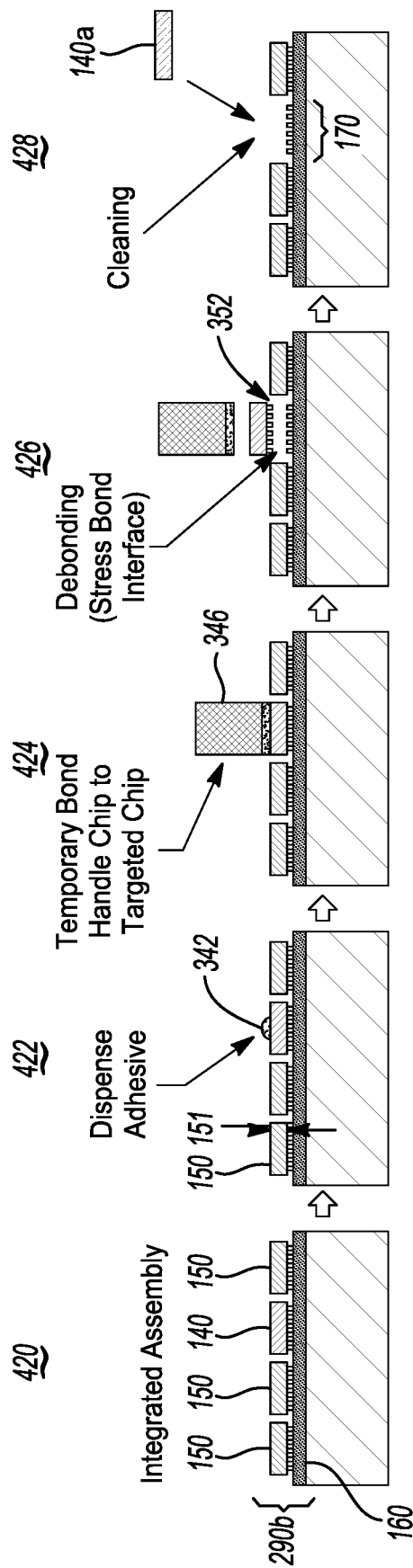
FIG. 9 is a process flow for debonding a thermocompression bonded thin substrate from a bonded part in accordance with one or more exemplary embodiments.

Referring to FIG. 9, a process flow for an example debonding of a thermocompression bonded thin substrate from a bonded part is shown in accordance with one or more exemplary embodiments. The bonded part 290b may include the second substrate 160, the first substrate 140, and one or more third substrates 150 (e.g., three illustrated). The first substrate 140 is shown bonded at a location 170 on the second substrate 160 in the condition 420.

In the condition 422, the adhesive layer 342 is dispensed onto the first substrate 140. The process for applying the adhesive layer 342 may be by dispensing a pre-determined volume of the adhesive and subsequently spreading the adhesive by spinning or applying the handle 346. The adhesive may be ultraviolet cured (through the glass handle). The handle 346 is secured to the first substrate 140 with the adhesive layer 342 in the condition 424. In the condition 426, the adhesive layer 342 is subjected to the solvent 352 to cause the first substrate 140 to break free of the second substrate 160. Exposure of the bonded part 290b to the solvent 352 generally leaves the third substrates 150 bonded to the second substrate 160. The third substrates 150 may have a different thickness 151 than the thickness 161 (FIG. 7) of the second substrate 160. In the condition 428, the second substrate 160 is cleaned at the location 170 in preparation for either the first substrate 140 to be rebonded or an additional (or replacement or another) first substrate 140a to be bonded to reform the bonded part 290b.

The handle 346 and relatively thick second substrate 160 generally serve to apply bending forces to the thermocompression bonded interface that lies away from the neutral axis. The swelling action releases the relatively thin first substrate 140 from the second substrate 160, as well as the adhesive layer 342 from the handle 346. The adhesive layer 342 maintains strength in the interior region between the first substrate 140 and the second substrate 160, making the thermocompression bond interface the weakest interface at the stack edges resulting in the peeling of the bonds. Typical shear strengths of the Au-to-Au thermocompression bonds are in a range of approximately 90 Newton (N) to approximately 100 N (e.g., approximately 9 kilograms to approximately 10 kilograms force for 4 millimeter by 4 millimeter substrates/chips). The mechanical debonding process has been tested multiple times without damaging the first substrate 140. Not damaging the first substrate 140 allows subsequent bonding of the first substrate 140 or another chip to the original second substrate 160 for reworking the bonded part 290b.

Figure 10:
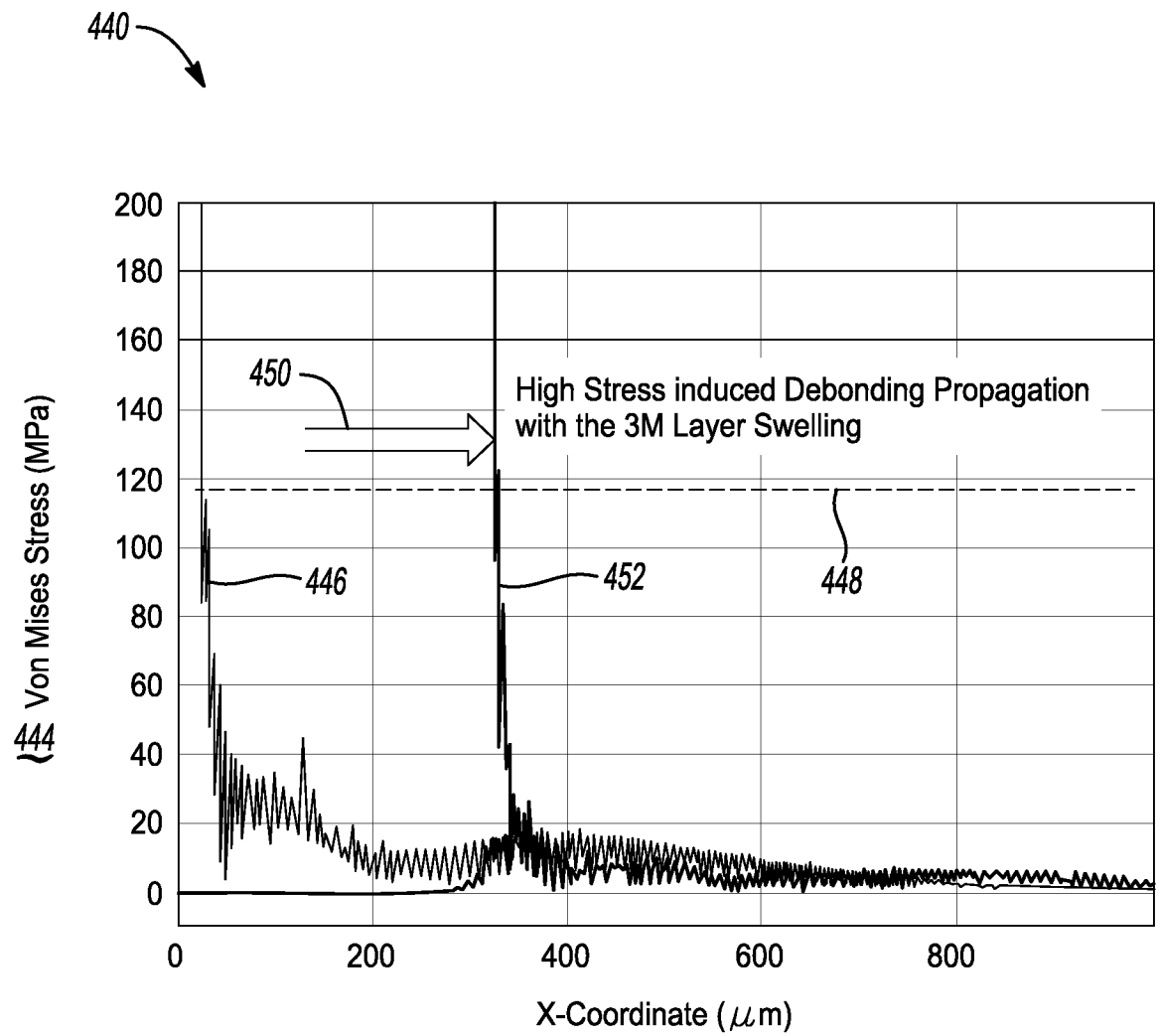
FIG. 10 is a graph of von Mises stress that causes the debonding in accordance with one or more exemplary embodiments.

Referring to FIG. 10, a graph 440 of an example plot of a von Mises stress that causes the debonding is shown in accordance with one or more exemplary embodiments. The graph 440 has X coordinate 442 in units of micrometers, and Y coordinate 444 for the von Mises stress in units of megapascals (MPa). Zero in the X coordinate 442 represents an outer edge of the first substrate 140.

A localized stress concentration curve 446 illustrates an initial stress on the thermocompression bonds. A peak location of the stress generally exceeds a threshold 448 for breaking the thermocompression bonds. As the solvent 352 seeps into the adhesive layer 342, the peak stress radially moves 450 toward a center of the first substrate 140 resulting in a new localized stress concentration curve 452.

The adhesive swelling mechanism invokes a different set of phenomena than in direct pulling cases that confines stress concentrations locally to a few array rows. The swelling causes the adhesive layer 342 to bulge outward, producing a positive curvature at the substrate edge and leverages the deformation against the internal bonded rows. The stress is induced because the bonding interface is away from the neutral axis during the bending induced by the adhesion swelling. The concentrated stress levels are maintained even as the debonding interface propagates inward across the array with the radial movement 450 of the swelling front of the adhesive layer 342 creating a dynamic unzipping of the bonded interface of the bump array. The confined area of stress allows relatively small forces (~0.3N) to debond the array in a row-by-row cascading manner. The row-by-row bond breaking allows minimal forces to debond the array and enabling the reworkable process.

Embodiments of the disclosure generally provide rework of thermocompression bonded substrate (e.g., chip) assemblies via a mechanical mechanism that unzips the fine pitch boned interface. The debonding may be used to remove selected chip(s) from an integrated chip assembly (2-dimensional or 3-dimensional). The debonding process does not involve heating the bonded parts. The technique is a low-force process that is approximately 100 time lower than direct pulling mechanisms. Furthermore, the debonding process does not affect neighboring chips.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A method for debonding a bonded part comprising:
attaching a handle to a third side of a first substrate of the bonded part with an adhesive layer, wherein:
the bonded part has a plurality of inter-substrate bond structures that couple a first side of the first substrate to a second side of a second substrate;
the third side of the first substrate is opposite the first side; and
the first substrate and the second substrate have different thicknesses;
absorbing a solvent into the adhesive layer;
swelling the adhesive layer in response to the absorbing of the solvent;
bending the first substrate in response to the swelling; and
breaking a plurality of thermocompression bonds between the plurality of inter-substrate bond structures and the second side of the second substrate in response to the bending to debond the first substrate.

2. The method according to claim 1, wherein the breaking comprises:
generating a plurality of localized stress concentrations at the plurality of thermocompression bonds in response to the bending; and
the bending is in response to the different thicknesses of the first substrate and the second substrate as the adhesive layer swells.

3. The method according to claim 2, wherein the swelling comprises:
moving the swelling of the adhesive layer radially inward over time as the solvent is absorbed further into the adhesive layer.

4. The method according to claim 3, wherein the breaking comprises:
disrupting of the plurality of thermocompression bonds row-by-row in response to the plurality of localized stress concentrations.

5. The method according to claim 1, wherein one or more third substrates bonded to the second substrate remain bonded to the second substrate as the first substrate is debonded.

6. The method according to claim 1, further comprising:
reforming the bonded part by a thermocompression bonding of the first substrate to the second substrate.

7. The method according to claim 1, further comprising:
reforming the bonded part by a thermocompression bonding of another first substrate to the second substrate.

8. The method according to claim 1, wherein the plurality of thermocompression bonds are one or more of gold-to-gold bonds, copper-to-copper bonds, aluminum-to-aluminum bonds, and indium-to-indium bonds.

9. The method according to claim 1, wherein the adhesive layer is an acrylic polymer layer and the solvent is acetone.

10. A debonding system comprising:
a handle couplable to a bonded part, wherein:
the bonded part has a plurality of inter-substrate bond structures that couple a first side of a first substrate to a second side of a second substrate;
a third side of the first substrate is opposite the first side; and
the first substrate and the second substrate have different thicknesses;
an adhesive layer configured to attach the handle to the third side of the first substrate; and
a solvent configured to be absorbed into the adhesive layer, wherein:
the adhesive layer swells in response to the absorption of the solvent;
the first substrate bends in response to the swelling; and
a plurality of thermocompression bonds between the plurality of inter-substrate bond structures and the second side of the second substrate is broken in response to the bending to debond the first substrate.

11. The debonding system according to claim 10, wherein:
the plurality of thermocompression bonds are broken by a plurality of localized stress concentrations at the plurality of thermocompression bonds generated in response to the bending; and
the bending is in response to the different thicknesses of the first substrate and the second substrate as the adhesive layer swells.

12. The debonding system according to claim 11, wherein the swell of the adhesive layer moves radially inward over time as the solvent is absorbed further into the adhesive layer.

13. The debonding system according to claim 12, wherein the plurality of thermocompression bonds are broken by a plurality of disruptions of the plurality of thermocompression bonds row-by-row in response to the plurality of localized stress concentrations.

14. The debonding system according to claim 10, wherein one or more third substrates bonded to the second substrate remain bonded to the second substrate as the first substrate is debonded.

15. The debonding system according to claim 10, further comprising:
a press configured to reform the bonded part by a thermocompression bonding of the first substrate to the second substrate.

16. The debonding system according to claim 10, further comprising:
a press configured to reform the bonded part by a thermocompression bonding of an additional first substrate to the second substrate.

17. The debonding system according to claim 10, wherein the plurality of thermocompression bonds are one or more of gold-to-gold bonds, copper-to-copper bonds, aluminum-to-aluminum bonds, and indium-to-indium bonds.

18. The debonding system according to claim 10, wherein the adhesive layer is an acrylic polymer layer and the solvent is acetone.

19. A method for debonding a bonded part comprising:
applying an adhesive layer to a third side of a first substrate of the bonded part, wherein:
the bonded part has a plurality of inter-substrate bond structures that couple a first side of the first substrate to a second side of a second substrate;
the plurality of inter-substrate bond structures couple one or more third substrates to the second side of the second substrate;
the third side of the first substrate is opposite the first side;
the first substrate and the second substrate have different thicknesses; and
the one or more third substrates have a different thickness than the second substrate;
attaching a handle to the adhesive layer;
absorbing a solvent into the adhesive layer;
swelling the adhesive layer in response to the absorbing of the solvent;

bending the first substrate in response to the swelling;
breaking a plurality of thermocompression bonds between the plurality of inter-substrate bond structures between the first substrate and the second substrate in response to the bending; and
leaving the one or more third substrates bonded to the second substrate.

20. The method according to claim 19, further comprising:
curing the adhesive layer by an exposure to a light directed through the handle.

* * * * *